(12) United States Patent
Hajimiri et al.

(10) Patent No.: US 8,362,839 B2
(45) Date of Patent: *Jan. 29, 2013

(54) CROSS-DIFFERENTIAL AMPLIFIER

(75) Inventors: Seyed-Ali Hajimiri, Pasadena, CA (US);
Scott D. Kee, Dana Point, CA (US);
Ichiro Aoki, San Clemente, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/194,845

(22) Filed: Jul. 29, 2011

(65) Prior Publication Data

US 2012/0176200 A1    Jul. 12, 2012

Related U.S. Application Data

(60) Division of application No. 12/686,161, filed on Jan. 12, 2010, now Pat. No. 7,999,621, which is a continuation of application No. 12/075,194, filed on Mar. 10, 2008, now Pat. No. 7,646,249, which is a continuation of application No. 11/638,639, filed on (Continued)

(51) Int. Cl.
*H03F 3/04* (2006.01)

(52) U.S. Cl. ........................... 330/297; 330/146

(58) Field of Classification Search ............ 330/51, 330/146, 285, 296, 297, 298
See application file for complete search history.

(56) References Cited

U.S. PATENT DOCUMENTS

| | | | |
|---|---|---|---|
| 3,098,200 A | 7/1963 | Jensen | |
| 3,157,839 A | 11/1964 | Brown | |
| 3,430,157 A | 2/1969 | Wood | |
| 3,449,685 A | 6/1969 | Holmes | |
| 3,652,947 A | 3/1972 | Hollingsworth | |
| 3,703,685 A | 11/1972 | Simopoulos et al. | |
| 3,919,656 A | 11/1975 | Sokal et al. | |
| 3,919,660 A | 11/1975 | Beurrier | |
| 3,967,161 A | 6/1976 | Lichtblau | |
| 4,117,415 A | 9/1978 | Hoover | |
| 4,165,493 A | 8/1979 | Harrington | |
| 4,181,889 A | 1/1980 | Davis et al. | |
| 4,283,685 A | 8/1981 | MacMaster et al. | |

(Continued)

FOREIGN PATENT DOCUMENTS

| | | |
|---|---|---|
| DE | 12 76 764 B | 9/1968 |
| EP | 0 379 202 A2 | 7/1990 |

(Continued)

OTHER PUBLICATIONS

PCT International Search Report in PCT/US03/07140 (a related application) mailed Oct. 10, 2003, 7 pgs.

(Continued)

*Primary Examiner* — Henry Choe
(74) *Attorney, Agent, or Firm* — Jackson Walker L.L.P.; Christopher J. Rourk

(57) ABSTRACT

A cross-differential amplifier is provided. The cross-differential amplifier includes an inductor connected to a direct current power source at a first terminal. A first and second switch, such as transistors, are connected to the inductor at a second terminal. A first and second amplifier are connected at their supply terminals to the first and second switch. The first and second switches are operated to commutate the inductor between the amplifiers so as to provide an amplified signal while limiting the ripple voltage on the inductor and thus limiting the maximum voltage imposed across the amplifiers and switches.

20 Claims, 7 Drawing Sheets

Related U.S. Application Data

Dec. 12, 2006, now Pat. No. 7,342,457, which is a continuation of application No. 11/208,833, filed on Aug. 22, 2005, now Pat. No. 7,157,975, which is a continuation of application No. 10/385,777, filed on Mar. 11, 2003, now abandoned.

(60) Provisional application No. 60/363,423, filed on Mar. 11, 2002.

(56) References Cited

U.S. PATENT DOCUMENTS

| | | | | |
|---|---|---|---|---|
| 4,305,043 | A | 12/1981 | Ho et al. | |
| 4,408,267 | A * | 10/1983 | Pruitt | 363/17 |
| 4,586,004 | A * | 4/1986 | Valdez | 330/300 |
| 4,607,323 | A | 8/1986 | Sokal et al. | |
| 4,706,038 | A | 11/1987 | Navidi et al. | |
| 4,717,884 | A | 1/1988 | Mitzlaff | |
| 4,772,856 | A | 9/1988 | Nojima et al. | |
| 4,916,410 | A | 4/1990 | Littlefield | |
| 4,994,755 | A | 2/1991 | Titus et al. | |
| 4,994,760 | A | 2/1991 | Roehrs | |
| 5,060,298 | A | 10/1991 | Waugh et al. | |
| 5,066,925 | A | 11/1991 | Freitag | |
| 5,130,664 | A | 7/1992 | Pavlic et al. | |
| 5,146,178 | A | 9/1992 | Nojima et al. | |
| 5,208,725 | A | 5/1993 | Akcasu | |
| 5,223,800 | A | 6/1993 | Karsten, Jr. et al. | |
| 5,254,881 | A | 10/1993 | Leonowich | |
| 5,327,337 | A | 7/1994 | Cripe | |
| 5,389,890 | A | 2/1995 | Burrage | |
| 5,469,115 | A | 11/1995 | Peterzell et al. | |
| 5,477,370 | A | 12/1995 | Little et al. | |
| 5,479,134 | A * | 12/1995 | Nishioka et al. | 330/273 |
| 5,483,197 | A * | 1/1996 | Nishioka et al. | 330/273 |
| 5,525,871 | A | 6/1996 | Bray et al. | |
| 5,600,575 | A * | 2/1997 | Anticole | 702/132 |
| 5,612,647 | A | 3/1997 | Malec | |
| 5,698,469 | A | 12/1997 | Mohwinkel et al. | |
| 5,742,205 | A | 4/1998 | Cowen et al. | |
| 5,749,051 | A | 5/1998 | Dent | |
| 5,781,071 | A | 7/1998 | Kusunoki | |
| 5,793,253 | A | 8/1998 | Kumar et al. | |
| 5,825,248 | A * | 10/1998 | Ozawa | 330/267 |
| 5,872,481 | A | 2/1999 | Sevic et al. | |
| 5,920,240 | A | 7/1999 | Alexanian et al. | |
| 5,926,068 | A | 7/1999 | Harr | |
| 5,939,766 | A | 8/1999 | Stolmeijer et al. | |
| 5,973,557 | A | 10/1999 | Miyaji et al. | |
| 6,008,703 | A | 12/1999 | Perrott et al. | |
| 6,011,438 | A | 1/2000 | Kakuta et al. | |
| 6,020,787 | A | 2/2000 | Kim et al. | |
| 6,026,126 | A * | 2/2000 | Gaetano | 375/296 |
| 6,057,571 | A | 5/2000 | Miller et al. | |
| 6,107,885 | A | 8/2000 | Miguelez et al. | |
| 6,114,911 | A | 9/2000 | Iwai et al. | |
| 6,121,842 | A | 9/2000 | Adlerstein et al. | |
| 6,121,843 | A | 9/2000 | Vampola et al. | |
| 6,137,354 | A | 10/2000 | Dacus et al. | |
| 6,160,455 | A | 12/2000 | French et al. | |
| 6,203,516 | B1 | 3/2001 | Kepley | |
| 6,211,728 | B1 * | 4/2001 | Chen et al. | 330/10 |
| 6,211,747 | B1 | 4/2001 | Trichet et al. | |
| 6,229,718 | B1 * | 5/2001 | Nilssen | 363/37 |
| 6,232,841 | B1 | 5/2001 | Bartlett et al. | |
| 6,252,455 | B1 | 6/2001 | Kurby et al. | |
| 6,320,913 | B1 | 11/2001 | Nakayama | |
| 6,351,185 | B1 | 2/2002 | Amrany et al. | |
| 6,369,651 | B1 * | 4/2002 | Dent | 330/127 |
| 6,383,858 | B1 | 5/2002 | Gupta et al. | |
| 6,385,033 | B1 | 5/2002 | Javanifard et al. | |
| 6,388,514 | B1 * | 5/2002 | King et al. | 330/10 |
| 6,400,227 | B1 | 6/2002 | Goldfarb et al. | |
| 6,408,168 | B1 | 6/2002 | Sessink | |
| 6,417,535 | B1 | 7/2002 | Johnson et al. | |
| 6,424,227 | B1 | 7/2002 | El-Sharawy | |
| 6,430,403 | B1 | 8/2002 | Kossor | |
| 6,445,248 | B1 | 9/2002 | Gilbert | |
| 6,448,847 | B1 | 9/2002 | Paul et al. | |
| 6,498,534 | B1 | 12/2002 | Kim et al. | |
| 6,509,722 | B2 | 1/2003 | Lopata | |
| 6,549,112 | B1 | 4/2003 | Gallina et al. | |
| 6,556,089 | B2 | 4/2003 | Wood | |
| 6,577,219 | B2 | 6/2003 | Visser | |
| 6,605,991 | B2 * | 8/2003 | Midya et al. | 330/10 |
| 6,707,367 | B2 | 3/2004 | Casteneda et al. | |
| 6,717,998 | B2 | 4/2004 | Adachi et al. | |
| 6,724,255 | B2 | 4/2004 | Kee et al. | |
| 6,756,849 | B2 | 6/2004 | Dupuis et al. | |
| 6,762,645 | B1 * | 7/2004 | Grant | 330/251 |
| 6,784,732 | B2 | 8/2004 | Hajimiri et al. | |
| 6,798,305 | B2 | 9/2004 | Aikawa et al. | |
| 6,809,586 | B1 * | 10/2004 | Hobboosh et al. | 330/10 |
| 6,812,771 | B1 | 11/2004 | Behel et al. | |
| 6,815,910 | B2 * | 11/2004 | Suzuki et al. | 315/291 |
| 6,816,012 | B2 | 11/2004 | Aoki et al. | |
| 6,825,726 | B2 * | 11/2004 | French et al. | 330/297 |
| 6,856,199 | B2 | 2/2005 | Komijani et al. | |
| 6,909,882 | B2 | 6/2005 | Hayashi et al. | |
| 6,917,245 | B2 | 7/2005 | Dupius et al. | |
| 6,940,355 | B2 | 9/2005 | Hajimiri et al. | |
| 6,982,605 | B2 | 1/2006 | Mondal et al. | |
| 6,999,747 | B2 | 2/2006 | Su | |
| 7,053,718 | B2 * | 5/2006 | Dupuis et al. | 330/311 |
| 7,058,374 | B2 * | 6/2006 | Levesque et al. | 455/127.3 |
| 7,062,237 | B2 | 6/2006 | Brandt | |
| 7,092,692 | B2 | 8/2006 | Tan et al. | |
| 7,095,819 | B2 | 8/2006 | Bellaouar et al. | |
| 7,129,784 | B2 | 10/2006 | Bhatti et al. | |
| 7,224,237 | B2 | 5/2007 | Hirano et al. | |
| 7,272,375 | B2 | 9/2007 | Tuttle et al. | |
| 7,274,253 | B2 | 9/2007 | Pan | |
| 7,276,966 | B1 | 10/2007 | Tham et al. | |
| 7,330,072 | B2 | 2/2008 | Brandt | |
| 7,646,249 | B2 * | 1/2010 | Hajimiri et al. | 330/297 |
| 7,650,132 | B2 * | 1/2010 | Darabi | 455/333 |
| 7,679,446 | B2 * | 3/2010 | Kim et al. | 330/282 |
| 7,764,125 | B2 * | 7/2010 | Dawe | 330/305 |
| 2002/0042256 | A1 | 4/2002 | Baldwin et al. | |
| 2002/0125945 | A1 | 9/2002 | Taylor | |
| 2002/0135422 | A1 | 9/2002 | Aoki et al. | |
| 2002/0173337 | A1 | 11/2002 | Hajimiri et al. | |
| 2003/0003952 | A1 | 1/2003 | Kim | |
| 2003/0021367 | A1 | 1/2003 | Smith | |
| 2003/0045263 | A1 | 3/2003 | Wakayama et al. | |
| 2003/0130006 | A1 | 7/2003 | Reynolds | |
| 2003/0169113 | A1 | 9/2003 | Komijani et al. | |
| 2003/0184369 | A1 | 10/2003 | Aoki et al. | |
| 2004/0081256 | A1 | 4/2004 | Shi et al. | |
| 2004/0178852 | A1 | 9/2004 | Neunaber | |
| 2005/0064840 | A1 | 3/2005 | Heydari et al. | |
| 2005/0070325 | A1 | 3/2005 | Bellaouar et al. | |
| 2005/0107043 | A1 | 5/2005 | Avasarala et al. | |
| 2005/0212791 | A1 | 9/2005 | Tsuchi | |
| 2006/0066396 | A1 | 3/2006 | Brandt | |
| 2006/0068734 | A1 | 3/2006 | Toyoda et al. | |
| 2006/0103457 | A1 | 5/2006 | Kumar et al. | |
| 2007/0170989 | A1 | 7/2007 | Pan | |

FOREIGN PATENT DOCUMENTS

| | | | |
|---|---|---|---|
| EP | 0 430 707 | A2 | 6/1991 |
| EP | 0 458 071 | A1 | 11/1991 |
| EP | 0 556 398 | A1 | 8/1993 |
| EP | 0 643 494 | A1 | 3/1995 |
| EP | 0 961 412 | A1 | 1/1999 |
| EP | 1 345 375 | A2 | 9/2003 |
| FR | 1 413 073 | A | 10/1965 |
| GB | 2 126 816 | A1 | 3/1984 |
| JP | 06-224605 | | 8/1994 |
| JP | 2917949 | | 7/1998 |
| JP | 2001-44862 | | 2/2001 |
| WO | WO 97/02654 | | 1/1997 |
| WO | WO 97/22177 | | 6/1997 |

| WO | WO 01/06644 | 1/2001 |
| WO | WO01/56171 | 8/2001 |
| WO | WO 2005/098880 | 10/2005 |

OTHER PUBLICATIONS

"Advances in Solid-State Power Supplies for RF Heating," *Electronics & Wireless World*, Reed Business Publishing, Sutton, Surrey, GB, vol. 94, No. 1632, Oct. 1, 1988, pp. 1013-1015, 22 (XP000001939).
Watanabe et al., "Analysis on a PWM Power Conversion Amplifier with IGBT Macro Model to Generate Gradient Magnetic Fields in MRI Systems," Power Electronics and Drive Systems, 1999, PEDS '99, *Proceedings of the IEEE 1999 International Conference on Hong Kong*, Jul. 27-29, 1999, Piscataway, NJ, USA, IEEE, US, pp. 127-132 (XP010352078).
Patent Abstracts of Japan, vol. 2002, No. 03, Apr. 3, 2002 & JP 2001 308649 A (Sharp Corp), Nov. 2, 2001, abstract.
Patent Abstracts of Japan, vol. 1995, No. 03, Apr. 28, 1995 & JP 06 334446 A (Mori Shinsaku), Dec. 2, 1994, abstract.
Patent Abstracts of Japan, vol. 1999, No. 02, Feb. 26, 1999 & JP 10 308639 A (Sony Corp), Nov. 17, 1998, abstract.
Asbeck, P., "Device and Circuit Approaches for Next-Generation Wireless Communications," Technical Feature, reviewed by Microwave Journal Editorial Board, 1998, 7 pgs.
Iwadare et al., "Even Harmonic Resonant Class E Tuned Power Amplifier Without RF Choke," *Electronics and Communications in Japan*, Part 1, vol. 79, No. 1, 1996.
Radisic et al., "Novel Architectures for High-Efficiency Amplifiers for Wireless Applications," *IEEE Transactions on Microwave Theory and Techniques*, vol. 46, No. 11, Nov. 1998, pp. 1901-1909.
Roufougaran, "A 900 MHz RF Power Amplifier in 1 μm CMOS for a Spread-Spectrum Communication Transceiver," (A thesis submitted in partial satisfaction of the requirements for the degree Master of Science in Electrical Engineering) The University of California, Los Angeles, CA, 1995.
Trask, "Class-F Amplifier Loading Networks: A Unified Design Approach," ATG Design Services, P.O. Box 25240, Tempe, Arizona 85285-5240, undated, pp. 1-4.
http://www.ece.ucsb.edu/rad/classe.html, RF Circuit Design at UC Santa Barbara: Jul. 18, 1999 (Revised Dec. 10, 1999), pp. 1-2.
Wei et al., "Analysis and Experimental Waveform Study on Inverse Class Class-F Mode of Microwave Power Fets," Alpha Industries, Inc., Woburn, MA, *2000 IEEE MTT-S Digest*, p. 525-528.
Inoue et al., "High-Efficiency 0.1 cc Power Amplifier Module for 900 MHz Personal Digital Cellular Telephones," *IEICE Trans. Electron*, vol. E82-C, No. 11, Nov. 1999, p. 1906-1912.
Inoue et al., Analysis of Class-F and Inverse Class-F Amplifiers, High Frequency and Optical Semiconductor Division, Mitsubishi Electric Corporation, Japan, 2000 *IEEE MTT-S Digest*, pp. 775-778.
Raab, "Class-E, Class-C, and Class-F Power Amplifiers Based upon a Finite Number of Harmonics," *IEEE Transactions on Microwave Theory and Techniques*, vol. 49, No. 8, Aug. 2001, pp. 1462-1468.
Search Report for PCT/US01/31813 dated Jun. 17, 2003, 9 pgs.
Robertson et al., "Solid State Power Amplifier Using Impedance-Transforming Branch-Line Couplers for L-Band Satellite Systems," Proceedings of the 23$^{rd}$ European Microwave Conference, Madrid, Sep. 6-9, 1993, Proceedings of the European Microwave Conference, Turnbridge Wells, Reed Exhibition Company, GB, Sep. 6, 1993, pp. 448-450, XP00629961, ISBN: 0-946821-23-2 Figures 1, 3.
Long et al., "The Modeling, Characterization and Design of Monolithic Inductors for Silicon RF IC's," IEEE Journal of Solid-State Circuits, vol. 32, No. 3, pp. 357-369, Mar. 1997.
Portilla et al., "High Power-Added Efficiency MMIC Amplifier for 2.4 GHz Wireless Communications," IEEE Journal of Solid State Circuits, vol. 34, No. 1, Jan. 1999.
King-Chun Tsai et al., "A 1.9-GHz, 1-W CMOS Class-E Power Amplifier for Wireless Communications," IEEE Journal of Solid State Circuits, vol. 34, No. 7, pp. 962-970, Jul. 1999.
Simbürger et al., A Monolithic Transformer Coupled 5-W Silicon Power Amplifier with 59% PAE at 0.9 GHz, IEEE Journal of Solid-State Circuits, vol. 34, No. 12, pp. 1881-1892, Dec. 1999.

Simbürger et al., "A Monolithic 2.5 V. 1 W Silicon Bipolar Power Amplifier With 55% PAE at 1.9 GHz," IEEE MTT-S Digest, pp. 853-856, 2000.
Y00 et al., "A Common-Gate Switched, 0.9W Class-E Power Amplifier with 41% PAE in 0.25 μm CMOS," Integrated Systems Laboratory (IIS), Swiss Federal Institute of Technology (ETH), Zurich Switzerland, 2000 Symposium on VLSI Circuits Digest of Technical Papers, pp. 56 & 57, 2000.
PCT International Search Report for PCT/US06/20297, mailed Oct. 11, 2008, 3 pgs.
Long, "Monolithic Transformers for Silicon RF IC Design," IEEE Journal of Solid-State Circuits, vol. 35, No. 9, pp. 1368-1382, Sep. 2000.
Tan et al., "A 900 MHz Fully-Integrated SOI Power Amplifier for Single-Chip Wireless Transceiver Applications," IEEE Journal of Solid-State Circuits, vol. 35, No. 10, pp. 1481-1486, Oct. 2000.
Gupta et al., "Design and Optimization of CMOS RF Power Amplifiers," IEEE Journal of Solid-State Circuits, vol. 36, No. 2, pp. 166-175, Feb. 2001.
Aoki et al., "A 2-4-GHz, 2.2-W, 2-V Fully-Integrated CMOS Circular-Geometry Active-Transformer Power Amplifier," Submitted to CICC-IEEE Custom Integrated Circuits Conference, San Diego, May 6-9, 2001, Department of Electrical Engineering, California Institute of Technology, Pasadena, CA 91125, USA May 6-9, 2001.
Kee et al., "7-MHz, 1.1-kW Demonstration of the New E/F$_{2,odd}$ Switching Amplifier Class," Department of Electrical Engineering, California Institute of Technology, Pasadena, CA 92115, 2001.
Translation of Japanese Office Action (Notice of Reasons for Refusal) mailed Dec. 11, 2007 (4 pgs.).
Search Report for PCT/US03/07157 dated Mar. 29, 2004, 4 pgs.
Aoki et al., "Distributed Active Transformer—A new Power-Combination and Impedance-Transformation Technique," *IEEE Transactions on Microwave Theory and Techniques*, vol. 50, No. 1, pp. 316-331, Jan. 2002.
PCT International Search Report in PCT/US03/07140 (a related application) mailed Jul. 10, 2003, 7 pgs.
Asbeck, P., "Device and Circuit Approaches for Next-Generation Wireless Communications," Technical Feature, reviewed by Microwave Journal Editorial Board, Feb. 1999, 7 pgs.
Iwadare et al., "Even Harmonic Resonant Class E Tuned Power Amplifier Without RF Choke," *Electronics and Communications in Japan*, Part 1, vol. 79, No. 1, Jan. 1995.
Roufougaran, "A 900 MHz RF Power Amplifier in 1 μm CMOS for a Spread-Spectrum Communication Transceiver," (A thesis submitted in partial satisfaction of the requirements for the degree Master of Science in Electrical Engineering) The University of California, Los Angeles, CA, Aug. 1995, 14 pgs.
Trask, "Class-F Amplifier Loading Networks: A Unified Design Approach," ATG Design Services, P.O. Box 25240, Tempe, Arizona 85285-5240, Jun. 1999, pp. 1-4.
http://www.ece.ucsb.edu/rad/classe.html, RF Circuit Design at UC Santa Barbara: Jul. 16, 1999 (Revised Dec. 10, 1999), pp. 1-2.
Wei et al., "Analysis and Experimental Waveform Study on Inverse Class Class-F Mode of Microwave Power Fets," Alpha Industries, Inc., Woburn, MA, *2000 IEEE MTT-S Digest*, Jun. 2000, p. 525-528.
Inoue et al., Analysis of Class-F and Inverse Class-F Amplifiers, High Frequency and Optical Semiconductor Division, Mitsubishi Electric Corporation, Japan, 2000 *IEEE MTT-S Digest*, Jun. 2000, pp. 775-778.
PCT International Search Report and Written Opinion, PCT/US2004/035794, mailed Mar. 10, 2005, 11 pgs.
PCT International Search Report and Written Opinion, PCT/US2005/003519, mailed Jun. 9, 2005, 12 pgs.
Itoh et al., "Even Harmonic Type Direct Conversion Receiver ICs for Mobile Handsets: Design Challenges and Solutions," 1999 IEEE Radio Frequency Integrated Circuits Symposium, Jul. 1999, pp. 53-56.
Matinpour et al., "A Low-Power Direct Conversion Receiver Module for C-Band Wireless Applications," 2001 IEEE Radio Frequency Integrated Circuits Symposium, Aug. 2001, pp. 263-266.
Tokumitsu et al., "A Low-Voltage. High-Power T/R Switch MMIC Using LC Resonators," *IEEE Transactions on Microwave Theory and Techniques*, vol. 43, No. 4, May 1995.

Kuhn et al., "A Resonant Switch for LNA Protection in Watt-Level CMOS Transceivers," *IEEE Transactions on Microwave Theory and Techniques*, vol. 53, No. 9, Sep. 2005.

PCT International Search Report and Written Opinion for PCT/US08/69623 mailed Mar. 20, 2009, 17 pgs.

PCT International Search Report and Written Opinion for PCT/US08/69615. mailed Nov. 5, 2008, 16 pgs.

PCT International Search Report and Written Opinion for PCT/US07/19472, mailed Mar. 26, 2008, 12 pgs.

PCT International Search Report and Written Opinion for PCT/US07/19473, mailed Mar. 26, 2008, 12 pgs.

PCT International Search Report and Written Opinion for PCT/US09/31108, mailed Jul. 10, 2009, 8 pgd.

Park et al., "Peak Detectors for Multistandard Wireless Receivers," IEEE Circuits and Devices Magazine, Nov./Dec. 2006 (4 pgs.).

* cited by examiner

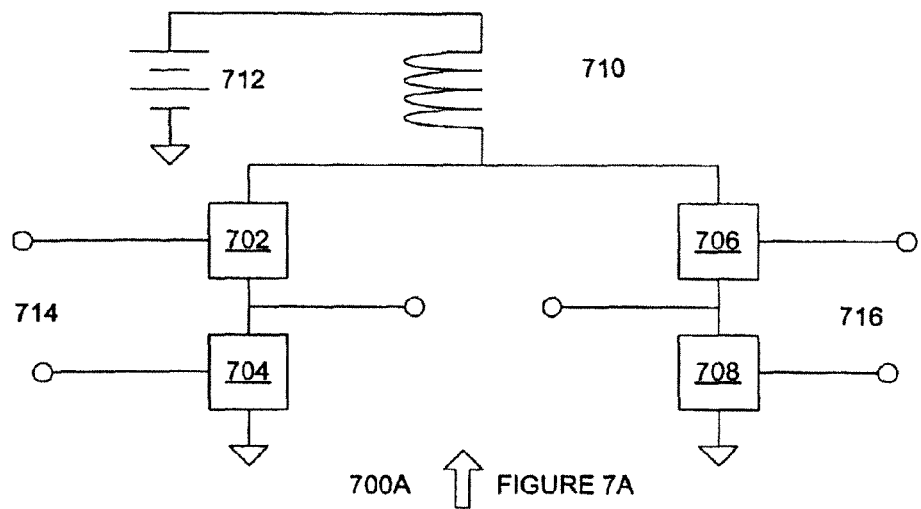
700A  FIGURE 7A
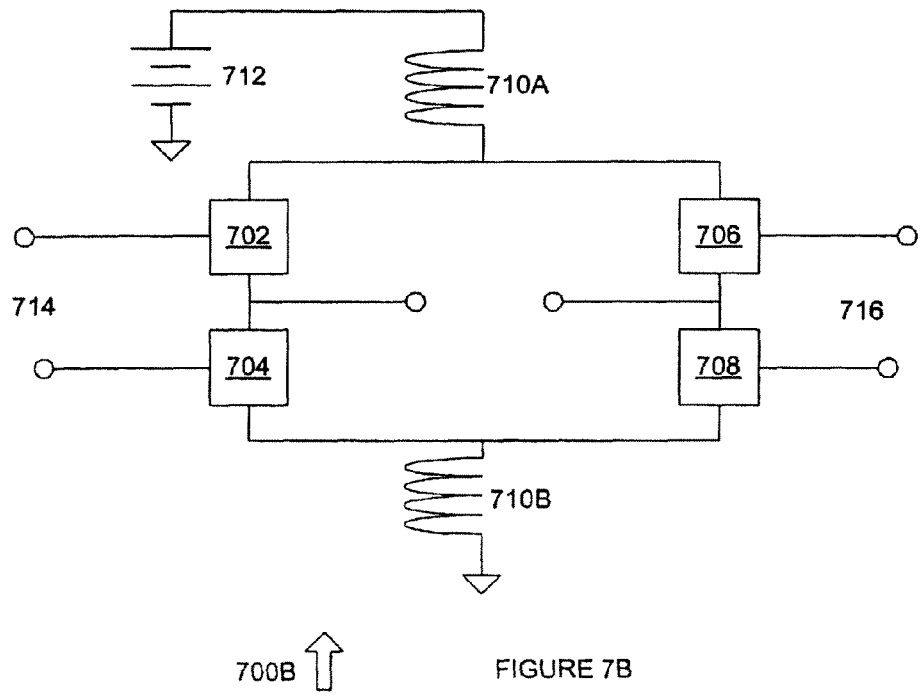
700B  FIGURE 7B

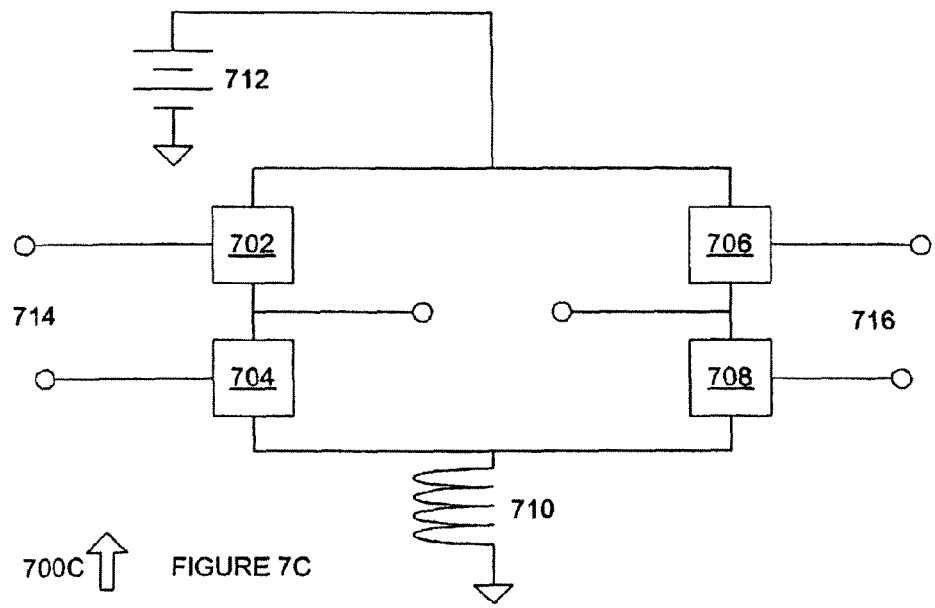
700C ↑ FIGURE 7C
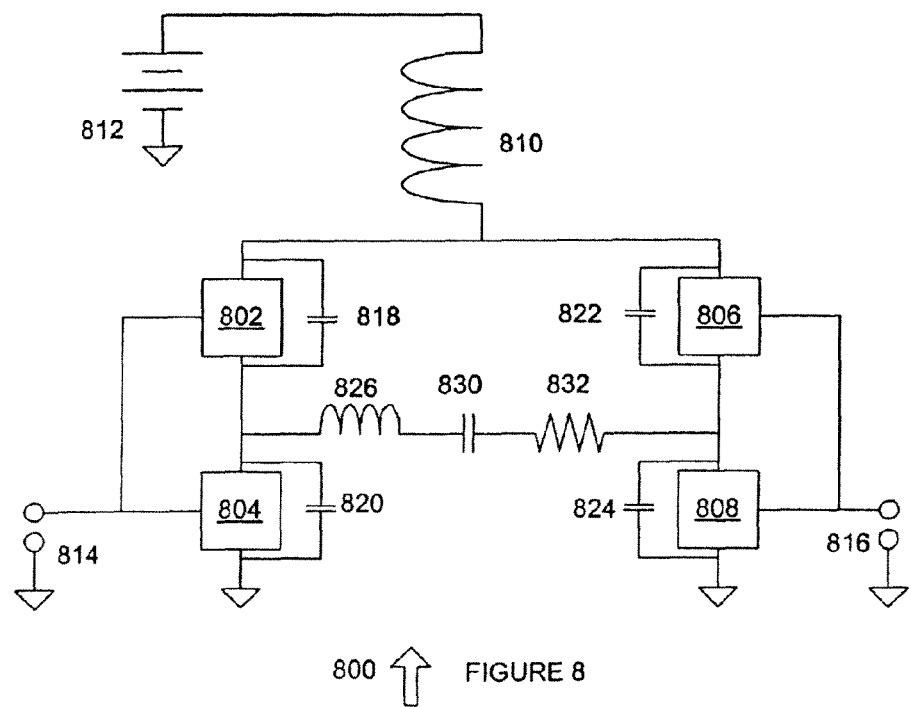
800 ↑ FIGURE 8

CROSS-DIFFERENTIAL AMPLIFIER

CROSS-REFERENCE TO RELATED APPLICATIONS

This application is a divisional application of U.S. application Ser. No. 12/686,161, "CROSS-'DIFFERENTIAL AMPLIFIER," filed Jan. 12, 2010, which is a continuation application of U.S. application Ser. No. 12/075,194, "CROSS-DIFFERENTIAL AMPLIFIER," filed Mar. 10, 2008, which is a continuation application of U.S. application Ser. No. 11/638,639, "CROSS-DIFFERENTIAL AMPLIFIER," filed Dec. 12, 2006, which is a continuation application of U.S. application Ser. No. 11/208,833, "CROSS-DIFFERENTIAL AMPLIFIER," filed Aug. 22, 2005, which is related to U.S. application Ser. No. 09/974,447, "CLASS E/F SWITCHING POWER AMPLIFIERS," filed Oct. 9, 2001. This application is also a continuation application of U.S. application Ser. No. 10/385,777, and claims priority to provisional U.S. application No. 60/363,423, filed Mar. 11, 2002, each of which are expressly incorporated by reference herein for all purposes.

The U.S. Government has certain rights to this invention pursuant to Grant No. DAAG55-97-1-0254 awarded by the Army and Grant No. NPO 30176 awarded by NASA.

FIELD OF THE INVENTION

The present invention pertains to the field of amplifiers. More specifically, the invention relates to a cross-differential amplifier that can operate at higher supply voltages.

BACKGROUND OF THE INVENTION

High efficiency saturated amplifiers and switching power amplifiers are known in the art. One drawback with the use of such amplifiers is the high peak voltages relative to the dc supply that the active devices must withstand in these modes of operation. In order to improve the gain, switching speed, and on-resistance of transistors, the breakdown voltage of the device is usually reduced. This tradeoff is exhibited by all modern semiconductor device technologies, including but not limited to field-effect transistors (FET), bipolar junction transistors (BJT), heterojunction bipolar transistors (HBT), high electron mobility transistors (HEMT), metal-semiconductor field-effect transistors (MESFET), metal-oxide semiconductor field effect transistors (MOSFET), and junction field-effect transistors (JFET). The effect is also independent of the semiconductor material system from which the devices are constructed, including but not limited to gallium arsenide (GaAs), indium phosphide (InP), silicon-germanium (SiGe), and silicon (Si) processes such as silicon bipolar (Si BJT), complementary metal oxide field effect transistor (CMOS) processes, and silicon-on-insulator (SOI) technologies.

In high efficiency switching amplifiers, such a reduction in breakdown voltage can be problematic. Unlike many applications in which the maximum voltage seen by any device is typically limited to the dc voltage of the power source, high efficiency switching amplifiers such as class E, class F, class inverse-F, current-mode class D and class E/F can require that the peak voltage seen by the devices be several times the dc supply. Class F, for instance, can require a peak voltage at least twice the supply voltage, whereas class E can require the device to withstand over 3.5 times the supply voltage without breaking down.

This high peak voltage relative to the dc power supply voltage applied results from the use of an inductor to connect the active device to the dc supply voltage. FIG. 1 is a diagram of a generalized circuit topology typically used in saturated and switching amplifiers such as class E, class F, and class E/F. The active device is connected to the dc supply through the inductor. Since the dc (or average) voltage drop across any inductor at steady state can be zero, the voltage waveform can have an average voltage equal to the supply voltage. This corresponds to a limitation on the waveform that the average area above the supply voltage and the area below it must be the same. This can be seen in FIG. 2, depicting typical waveforms for a representative switching amplifier, with equal areas above and below the supply voltage shaded.

As can be seen in FIG. 2, the active device spends a significant portion of its time in a low voltage state. This is so that the active device can conduct the bulk of its current during this time, thereby reducing the power dissipation in the device, resulting in high efficiency. Unfortunately, this results in a very large area below the supply voltage, necessitating an equally large area above it. Thus the voltage during the times when the switch is not low can be significantly greater than the supply voltage, usually by a factor of two to four.

In a typical CMOS process, for instance, the device breakdown can be less than 6 V whereas the supply voltage is in many cases 3.3 V or higher. With a 3.3 V supply, the class E amplifier can produce waveforms with peak voltage greater than 11V, almost twice that which a CMOS device with 6 V breakdown can tolerate. Thus in this application, the supply voltage can be changed, a more expensive high-voltage process can be used, or a less efficient type of power amplifier with a lower peak voltage can be employed. If the supply voltage cannot be changed, such as if it is coming from a battery or if other circuits on the same supply cannot change their supply voltage, the high peak to supply ratio of the traditional switching amplifiers thus forces a sacrifice in either cost or performance.

SUMMARY OF THE INVENTION

In accordance with the present invention, a cross-differential amplifier is provided that overcomes known problems with existing amplifiers.

In particular, a cross-differential amplifier is provided that allows devices with low breakdown voltage such as high-frequency transistors or integrated circuit transistors to be used with higher supply voltages.

In accordance with an exemplary embodiment of the present invention, a cross-differential amplifier is provided. The cross-differential amplifier includes an inductor connected to a dc power source at a first terminal. A first and second switching device, such as transistors, are connected to the inductor at a second terminal. A first and second amplifier are connected to the first and second switching devices at their supply points. The first and second switch are configured to connect the two amplifiers to the inductor in an alternating fashion so that each amplifier receives current and that the average voltage on the second terminal of the inductor is greater than the average voltage of one of the amplifiers at its supply point.

The present invention provides many important technical advantages. One important technical advantage of the present invention is an amplifier that can be used in high efficiency switching modes, such as in classes E, inverse F, E/F$_{XX}$, current-mode class D, and other suitable classes, while operating from higher supply voltages while using lower breakdown voltage devices.

Those skilled in the art will appreciate the advantages and superior features of the invention together with other important aspects thereof on reading the detailed description that follows in conjunction with the drawings.

BRIEF DESCRIPTION OF THE SEVERAL VIEWS OF THE DRAWINGS

FIGS. 7A through 7C are diagrams of cross differential amplifiers in accordance with exemplary embodiments of the present invention;

FIG. 8 is a diagram of a cross differential amplifier which can be operated in class E mode in accordance with an exemplary embodiment of the present invention;

DETAILED DESCRIPTION OF THE INVENTION

Figure 1:
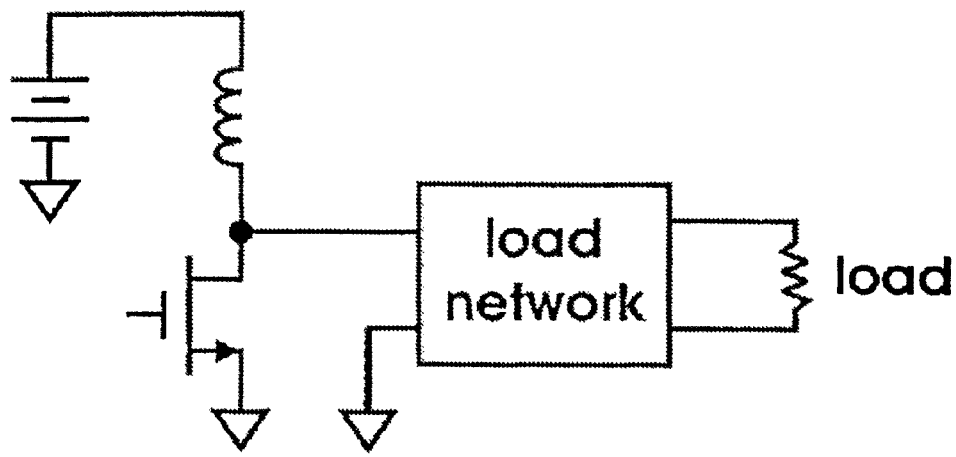
FIG. 1 is a diagram of a typical saturated or switching amplifier using an inductor for the supply connection.
Figure 2:
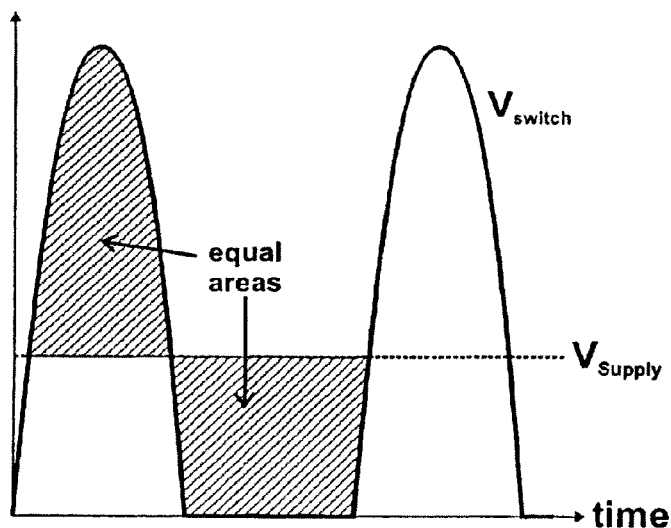
FIG. 2 is a diagram of typical saturated or switching amplifier waveforms, showing the equal areas above and below the supply voltage due to the inductive supply connection.

In the description that follows like parts are marked throughout the specification and drawings with the same reference numerals, respectively. The drawing figures are not necessarily to scale and certain features can be shown in somewhat generalized or schematic form in the interest of clarity and conciseness.

Figure 3:
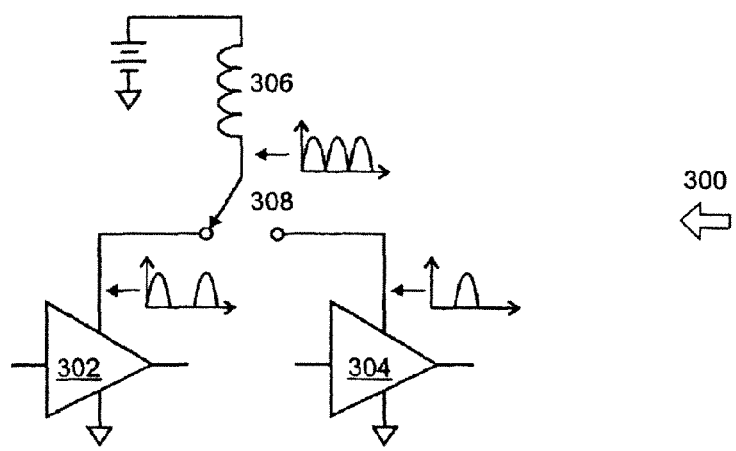
FIG. 3 is a diagram of a cross differential amplifier in accordance with an exemplary embodiment of the present invention.

FIG. 3 is a diagram of a cross differential amplifier 300 in accordance with an exemplary embodiment of the present invention. Cross differential amplifier 300 can include two amplifying sections 302 and 304, which share common supply inductor 306 through two-way switch 308. Amplifying sections 302 and 304 are driven with different phases relative to one another so that their peak voltages occur at different times. By commutating supply inductor 306 between amplifying sections 302 and 304, the average voltage at the terminal of supply inductor 306 is greater than the average voltage of the individual amplifying sections 302 and 304.

Figure 4:
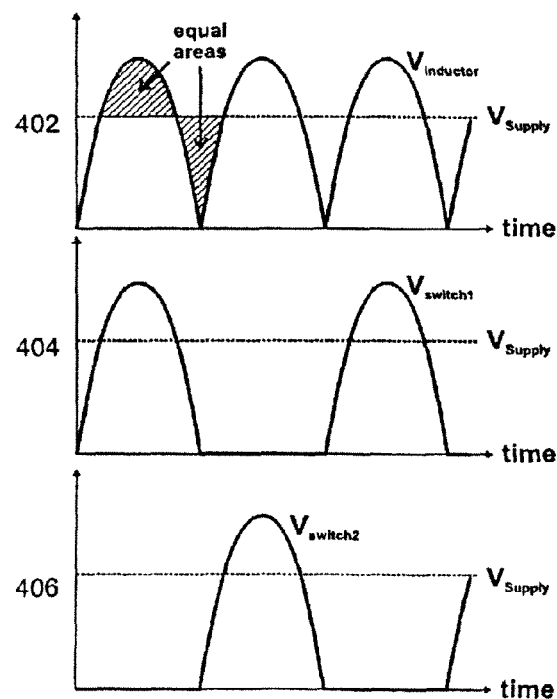
FIG. 4 is a diagram of voltage waveforms in accordance with an exemplary embodiment of the present invention.

For instance, in one exemplary implementation, the two amplifying sections 302 and 304 are driven in a complementary fashion, with supply inductor 306 connection switched so as to keep the amplifying section 302 or 304 which has a high voltage connected to supply inductor 306. In one exemplary embodiment, this operation produces the waveforms 402 through 406 of FIG. 4. Since supply inductor 306 is not exposed to the low voltage of the amplifying section 302 and 304 cycles in this exemplary embodiment, the area below the dc supply voltage on the inductor voltage waveform 402 is significantly reduced. This allows the area above the dc supply to be reduced, reducing significantly the peak voltage. If the amplifying sections 302 and 304 are switching amplifiers so that the voltage in the conducting cycle of each amplifying section is nearly zero, the cross differential technique can result in a factor of two decrease in the peak voltage.

Figure 5:
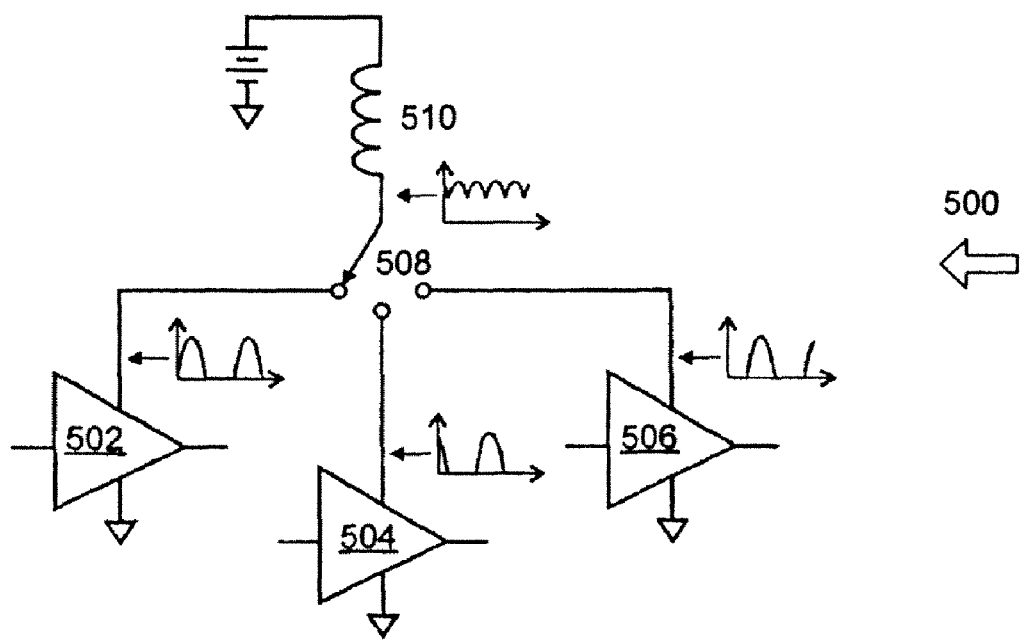
FIG. 5 is a diagram of a cross differential amplifier with three commutated amplifiers in accordance with an exemplary embodiment of the present invention.

FIG. 5 is a diagram of three-way cross-differential amplifier 500 in accordance with an exemplary embodiment of the present invention. By using more than two amplifiers, each with different phase, the inductor can be commutated between the three amplifying sections 502 through 506 to even further reduce the peak voltages on the amplifying sections 502 through 506. For instance, in one exemplary embodiment three amplifying sections 502 through 506 can be used, with 120 degrees of phase separation between any two amplifying sections. This operation results in the peak voltages for the several amplifying sections 502 through 506 occurring at three different points in the cycle so that switch 508 can commutate inductor 510 to a voltage relatively close to the peak device voltage throughout the cycle.

This technique can be extended to utilize a suitable number "n" of desired amplifiers, by using an n-way switch connecting inductor 510 to "n" amplifiers with various operating phases. By using larger numbers of amplifiers, the peak voltage can be made to approach the dc power supply voltage.

Figure 6:
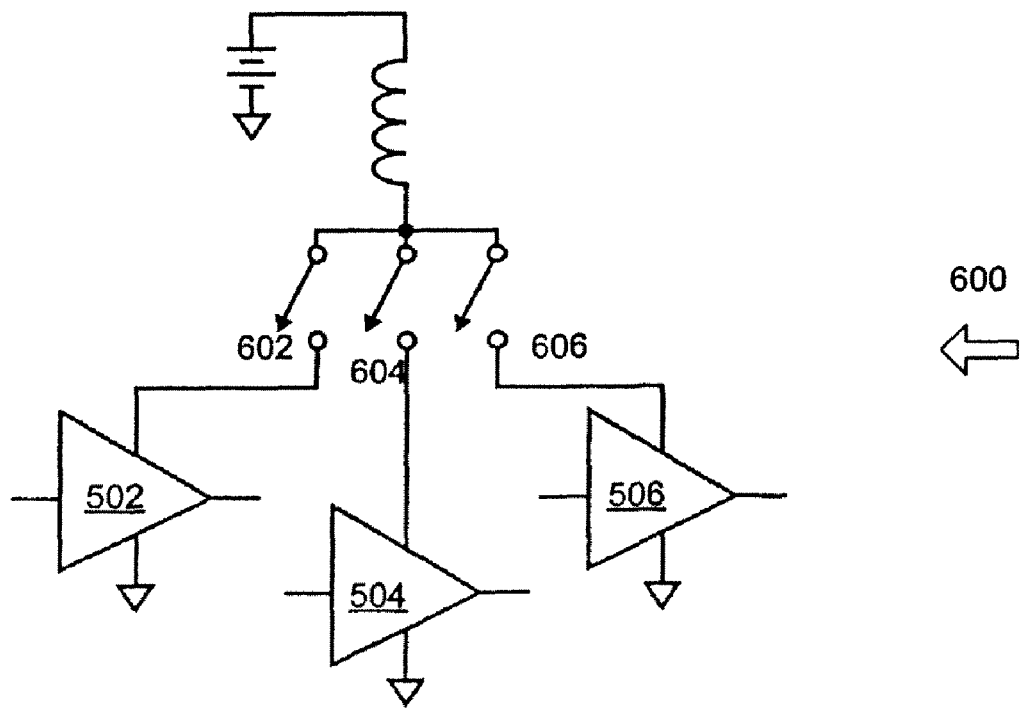
FIG. 6 is a diagram of a cross differential amplifier with several two terminal switches used to implement the n-way commutation switch in accordance with an exemplary embodiment of the invention.

FIG. 6 is a diagram of an exemplary embodiment of cross differential amplifier 600 wherein switch 508 has been implemented as "n" two terminal switches 602 through 606. This topology allows switch 508 to be implemented by conventional two terminal switches 602 through 606, such as transistors.

FIG. 7A is a diagram of a cross differential amplifier 700A in accordance with an exemplary embodiment of the present invention. In this exemplary embodiment, devices 702 and 706 are used as switches to commutate inductor 710 between devices 704 and 708, which operate as amplifiers. The nodes where devices 702 and 706 connect to devices 704 and 708 can be used as outputs, and can drive a differential load, independent single-ended loads, or other suitable loads. Devices 702 and 706 can be operated in a complementary fashion so as to connect inductor 710 to devices 704 and 708 in an alternating fashion, so as to reduce the peak voltage on devices 704 and 708 by reducing the time that the voltage on the commutating terminal of inductor 710 is significantly lower than the supply voltage.

Device 702, device 704, device 706 and device 708 can be Si transistors, SiGe transistors, GaAs transistors, CMOS transistors, CMOS SOI transistors, HBT transistors, LDMOS transistors, HEMT transistors, MESFET transistors or other suitable switches or three terminal devices having a control terminal (including but not limited to a gate or base), and two conducting terminals (including but not limited to an emitter and collector or a drain and source). In one exemplary embodiment, device 704 and device 708 can be current sources having controllable current magnitude, can be switches or devices operated as switches, or can be other suitable devices. Device 702 and device 706 can be switches, devices operated as switches, or other suitable devices.

Cross differential amplifier 700A can also be operated an that device 704 and device 708 are used as the commutating switches while using device 702 and device 706 as the amplifying devices. In this mode, device 704 and device 708 alternately force device 702 and device 706 to support the voltage at the second terminal of inductor 710, allowing a reduction of peak voltage on device 702 and device 706 for the same dc supply voltage.

Cross differential amplifier 700A can also be used so that all four devices are switching, so that each pair of switching amplification devices acts as a commutator for the other, or in other suitable manners.

FIG. 7C is a diagram of a cross differential amplifier 700C where inductor 710 has been placed at the ground side of the circuit and the supply voltage is connected directly to device 702 and device 706. Cross differential amplifier 700C can behave substantially like cross differential amplifier 700A in regards to its behavior. In cross differential amplifier 700C, device 704 and device 708 can be used as switches to connect device 702 and device 706 between supply 712 and inductor 710, resulting in the same peak voltage reduction effect on device 702 and device 706. In this case, the inductor is connected to ground, so that the effect is achieved by connecting devices 702 and 706 to the inductor 710 in such a way as to reduce the time that the inductor sees voltages significantly higher than ground. For instance, in one exemplary embodiment, devices 704 and 708 can be operated to commutate inductor 710 between devices 702 and 706 so as to keep the inductor connected throughout the cycle to the amplifying device which has the most negative voltage at its output terminal Cross-differential amplifier 700C can also be operated so that device 702 and device 706 are used as commutating switches, while using devices 704 and 708 as amplifying devices. In this mode, devices 702 and 706 alternately force the amplifying devices to support the voltage difference between the power supply voltage and the commutating point of inductor 710, allowing a reduction of the peak voltage on devices 704 and 708.

Cross-differential amplifier 700C can also be used so that all four devices are switching so that each pair of amplifying switches commutates the current for the other, or in other suitable manners.

FIG. 7B is a diagram of cross differential amplifier 700B in accordance with an exemplary embodiment of the present invention. Cross differential amplifier 700B includes inductor 710A connected to device 702 and device 706, and inductor 710B connected to device 704 and device 708. Since these inductors are connected in series with each other and with the dc power supply 712, this implementation also operates substantially the same as cross differential amplifier 700A. By using devices 702 and 706 as switches to commutate inductors 710A and 710B between devices 704 and 708, which are used as amplifying devices, the voltage ripple on inductors 710A and 710B can be reduced, which also reduces the peak voltage seen on device 702 and 706 and devices 704 and 708 for a given dc supply voltage.

Cross-differential amplifier 700B can also be operated so that device 704 and device 708 are used as commutating switches, while using devices 702 and 706 as amplifying devices. In this mode, devices 704 and 708 alternately force the amplifying devices to support the voltage difference between the supply inductors 710A and 710B, allowing a reduction of the peak voltage on devices 702 and 706.

Cross-differential amplifier 700B can also be used on that all four devices are switching so that each pair of amplifying switches commutates the current for the other, or in other suitable manners.

In operation, the load network and bias points for the amplifiers of cross differential amplifiers 700A, 700B and 700C can be selected so as to allow operation in class A, class A/B, class B, class C, class E, inverse F, and class $E/F_{xx}$ (signifying any class of switching amplifier operation belonging to the family of switching amplifiers E/F). An example of class E/F amplifiers is provided by U.S. application Ser. No. 09/974,557, "Class E/F Switching Power Amplifiers," filed Oct. 9, 2001, and which is hereby incorporated by reference for all purposes. Cross differential amplifiers 700A through 700C can be used where switching amplifier tunings are used since all four devices can be made to simultaneously operate in the high efficiency class E, inverse F, current-mode class D, and class $E/F_{xx}$ modes.

FIG. 8 is a diagram of a cross differential amplifier 800 which can be operated in class-E mode in accordance with an exemplary embodiment of the present invention. Cross differential amplifier 800 includes device 802, device 804, device 806, and device 808, which can be operated as switches, or other suitable devices. Device 802 and device 808 can be operated as a first set in opposition to the phase of device 806 and device 804, such that current is driven through inductor 836, capacitor 830, and resistor 832 in a first direction through device 802 and device 808, and then in a second direction through device 806 and device 804. Inductor 826, capacitor 830, and resistor 832 can be sized to resonate at the operating frequency, and to supply a suitable impedance at the operating frequency so as to compensate for capacitor 818, capacitor 820, capacitor 822, and capacitor 824, which can be the internal capacitances of devices 802 through 808, respectively, or other suitable capacitances, so as to allow cross differential amplifier 800 to operate in the class-E mode of operation. In one exemplary embodiment, capacitors 818 through 824 can be the intrinsic capacitance of devices 802 through 808, respectively, can be capacitances between devices 802 through 808 and external components or features, can be a suitable combination of such capacitances, or can include other suitable capacitors or capacitance. In another exemplary embodiment, resistor 832 can be a resistive load to be driven, the resistive component of a reactive load to be driven, an antenna, the input of an amplifier or other circuit, or other suitable loads or combinations of loads.

Using this technique, inductor 810 which is used for class E operation does not have a large voltage across it for long periods of time since it does not connect directly to ground as is the case in conventional class E amplifiers. In this manner, the peak voltage at the node shared by device 802, device 806, and inductor 810 is less than the peak voltage of the equivalent node of a conventional class-E switching differential amplifier such as one that uses independent inductors to connect each of the amplifying devices to the supply, or of the equivalent node of a conventional class-E switching amplifier. By selecting appropriate values for inductor 826, capacitor 830, resistor 832, and capacitors 818 through 824, each device 802 through 808 can be switched at a time when the voltage is at or close to zero, so as to minimize the turn-on switching losses due to capacitances 818 through 824 (equal to $\frac{1}{2}CV^2f_0$), and which results in undesirable power losses and heating. Cross differential amplifier 800 can also be used in the configurations shown in FIGS. 7B and 7C, with supply inductors in other suitable locations. Additionally, the load network can consist of the series RLC network depicted in FIG. 8, or other suitable single-ended or differential loads meeting the class-E tunings conditions for each amplifying device.

Figure 9:
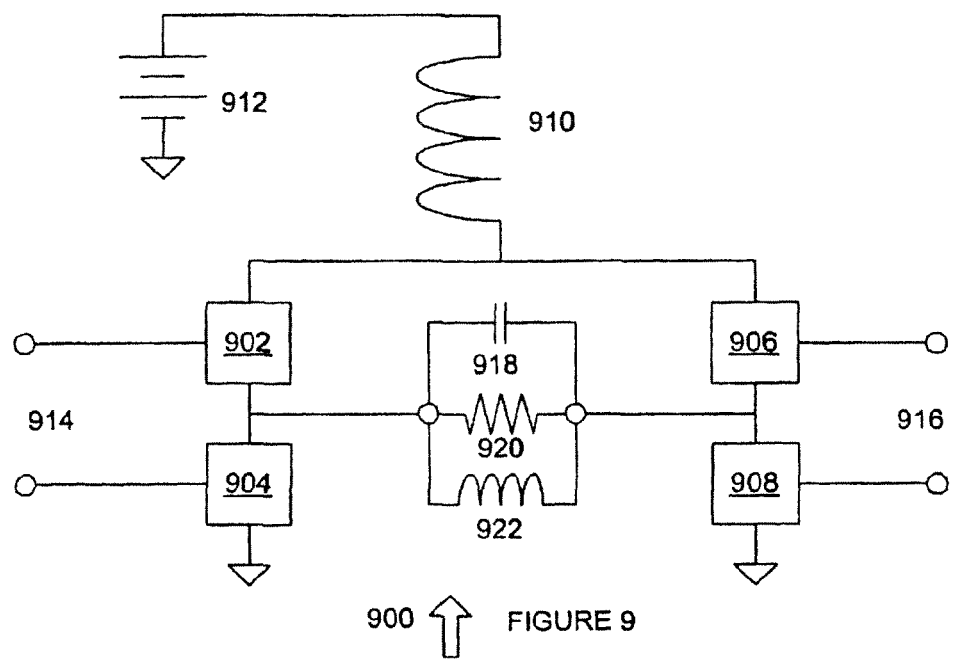
FIG. 9 is a diagram of a cross differential amplifier which can be operated in class inverse F, current-mode class D, or class $E/F_{xx}$ modes in accordance with an exemplary embodiment of the present invention.

FIG. 9 is a diagram of a cross differential amplifier 900 which can be operated in current-mode class D, class inverse F or class E/F modes of operation in accordance with an exemplary embodiment of the present invention. Cross differential amplifier 900 includes device 902, device 904, device 906 and device 908, each of which can be operated as switches or other suitable devices, and inductor 910 and supply voltage 912. Device 902 and device 908 operate in phase with each other and opposite to the phase of device 906 and device 904, such that in the first state of operation, current flows through inductor 910 and device 902 across a load formed by capacitor 918, resistor 920, and inductor 922, and through device 908. Likewise, in the second state of operation, current flows through inductor 910 and device 906 through the load formed by capacitor 918, resistor 920, and inductor 922 connected in parallel, and through device 904. Inductor 922, capacitor 918, and resistor 920 are selected to provide suitable tuning for current-mode class D, class inverse F or class E/$F_{xx}$ modes of operation. In one exemplary embodiment, resistor 920 can be a resistive load to be driven, the resistive component of a reactive load to be driven, an antenna, the input of an amplifier or other circuit, or other suitable loads or combinations of loads.

Using this technique, the supply inductor 910 which can be used for current-mode class D, inverse-F and E/$F_{xx}$ operation can avoid having large voltage across it for periods of time since it is not connected directly to ground for large portions of the cycle as is the case in conventional current-mode class D, inverse-F and E/$F_{xx}$ amplifiers. This configuration allows the peak voltage of the node shared by the inductor 910 and devices 902 and 906 to be less than the peak voltage of the equivalent node of a conventional class inverse F or class E/$F_{xx}$ switching differential amplifier using two inductors to connect the two devices to the voltage source, each one individually, or the equivalent node of a conventional class inverse F, current-mode class D, or class E/$F_{xx}$ switching amplifier. Cross differential amplifier 900 can also be used in the configurations shown in FIGS. 7B and 7C, with supply inductors in other suitable locations. Additionally, the load network used can be a suitable single-ended or differential network which results in current-mode class D, inverse-F or E/$F_{xx}$ operation.

Figure 10:
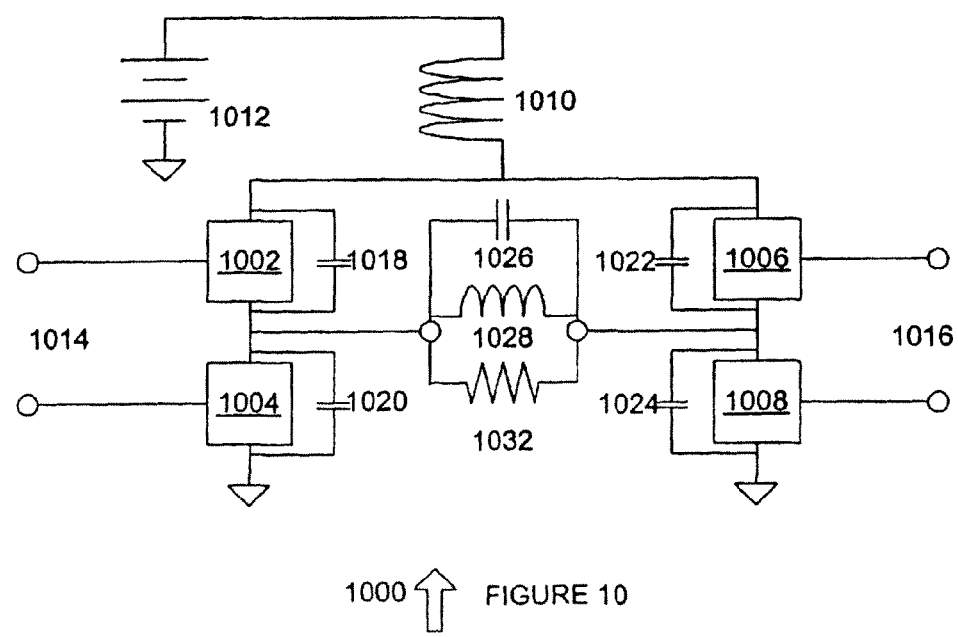
FIG. 10 is a diagram of a cross differential amplifier with intrinsic capacitances and which can be operated in class inverse F, current-mode class D, or class $E/F_{xx}$ modes in accordance with an exemplary embodiment of the present invention.

FIG. 10 is a diagram of cross differential amplifier 1000 with intrinsic capacitances which can be operated in class E/$F_{xx}$ mode in accordance with an exemplary embodiment of the present invention.

Cross differential amplifier 1000 includes device 1002, device 1004, device 1006, and device 1008, which can be operated as switches, current sources, or other suitable devices. Devices 1002 and 1006 are connected to inductor 1010. Device 1002 and device 1008 operate in phase with each other and opposite to the phase of device 1006 and device 1004, such that current flows in the first state of operation through inductor 1010 and device 1002 across the load formed by inductor 1028, capacitor 1026, and resistance 1032 through device 1008. In the second state of operation, current flows through inductor 1010 and device 1006 and then across the load formed by capacitor 1026, inductor 1028, and resistance 1032 through device 1004. Inductor 1028 and capacitor 1026 are selected to resonate at the operating frequency, and to compensate for capacitors 1018 through capacitor 1024 so as to provide class inverse F mode or class E/$F_{xx}$ mode of operation. Capacitors 1018 through 1024 can be the intrinsic or parasitic capacitance of the devices, external capacitances, or other capacitances. Likewise, other intrinsic or parasitic capacitances of cross differential amplifier 1000 can be compensated for. In one exemplary embodiment, resistor 1032 can be a resistive load to be driven, the resistive component of a reactive load to be driven, an antenna, the input of an amplifier or other circuit, or other suitable loads or combinations of loads.

Using this technique, inductor 1010 which can be used for E/$F_{xx}$ operation can avoid having large voltage across it for large periods of time since it is not connected directly to ground for large portions of the cycle, as is the case in conventional inverse-F and E/$F_{xx}$ amplifiers. This configuration allows the peak voltage of the node shared by the inductor 1010 and devices 1002 and 1006 to be less than the peak voltage of the equivalent node of a conventional switching differential amplifier, such as one using two separate inductors to connect the two devices individually to the voltage source, or the equivalent node of a conventional switching amplifier. Cross differential amplifier 1000 can also be used in the configurations shown in FIGS. 7B and 7C, with supply inductors in other suitable locations. Additionally, the load network used can be any suitable single-ended or differential network which results in E/$F_{xx}$ operation.

Figure 11:
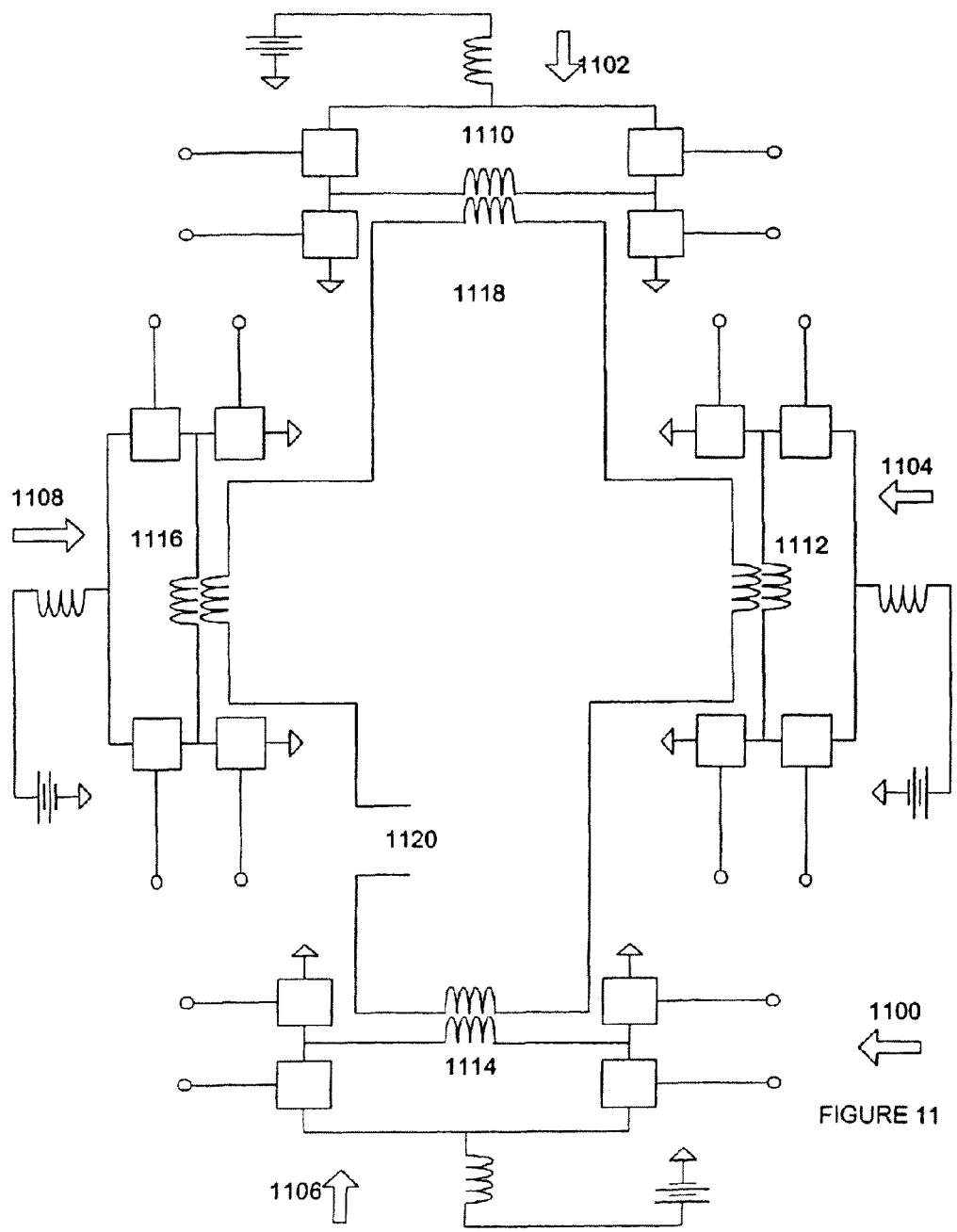
FIG. 11 is a diagram of a distributed active transformer in accordance with an exemplary embodiment of the present invention.

FIG. 11 is a diagram of a distributed active transformer 1100 in accordance with an exemplary embodiment of the present invention. Distributed active transformer 1100 includes cross differential amplifiers 1102, 1104, 1106 and 1108, which are connected to provide primary winding segments 1110, 1112, 1114, and 1116. Secondary winding 1118 includes output 1120, and is magnetically connected to the primary winding sections 1110 through 1116. The current through each primary winding section is controlled by the corresponding cross differential amplifier, such that a distributed transformer architecture is provided that uses cross differential amplifiers as primary winding sections. Although four cross differential amplifiers are shown in this implementation, any suitable number of amplifying devices can be combined in the distributed active transformer. The various cross differential amplifiers can also be used in the configurations shown in FIGS. 7B and 7C, with inductors in other suitable locations.

Although exemplary embodiments of the system and method of the present invention has been described in detail herein, those skilled in the art will also recognize that various substitutions and modifications can be made to the systems and methods without departing from the scope and spirit of the appended claims.

What is claimed is:

1. A method for operating an amplifier circuit comprising:
    operating a first device and a second device as amplifiers to generate an output in a first mode of operation;
    operating a third device and a fourth device to commutate an inductor in the first mode of operation;
    operating the first device and the second device to commutate the inductor in a second mode of operation; and
    operating the third device and the fourth device as amplifiers to generate the output in the second mode of operation.

2. The method of claim 1 wherein the first device is operated at a radio frequency.

3. The method of claim 1 wherein the first and second devices are operated at a radio frequency.

4. The method of claim 1 wherein the first, second and third devices are operated at a radio frequency.

5. A method for operating an amplifier circuit comprising:
    operating a first device and a second device as amplifiers to generate an output in a first mode of operation;
    operating the first device and the second device as switches to commutate an inductor in a second mode of operation;
    operating a third device and a fourth device to commutate an inductor between the first device and the second device in the first mode of operation; and
    operating the third device and the fourth device as amplifiers to generate the output in the second mode of operation.

6. The method of claim 5 wherein the first device is operated at a radio frequency.

7. The method of claim 5 wherein the first and second devices are operated at a radio frequency.

8. The method of claim 5 wherein the first, second and third devices are operated at a radio frequency.

9. A method for operating an amplifier circuit comprising:
operating a first device and a second device as amplifiers to generate an output in a first mode of operation;
operating a third device and a fourth device as switches to commutate an inductor between the first device and the second device in the first mode of operation;
operating the first device and the second device as switches to commutate the inductor between the third device and the fourth device in a second mode of operation; and
operating the third device and the fourth device as amplifiers to generate the output in the second mode of operation.

10. The method of claim 9 wherein the first device is operated at a radio frequency.

11. The method of claim 9 wherein the first and second devices are operated at a radio frequency.

12. The method of claim 9 wherein the first, second and third devices are operated at a radio frequency.

13. The method of claim 1 wherein the first device and the second device are operated as one of class A amplifiers, class A/B amplifiers, class B amplifiers, class C amplifiers, class E amplifiers, inverse F amplifiers, or class E/F amplifiers.

14. The method of claim 1 wherein the third device and the fourth device are operated as one of class A amplifiers, class A/B amplifiers, class B amplifiers, class C amplifiers, class E amplifiers, inverse F amplifiers, or class E/F amplifiers.

15. The method of claim 5 wherein the first device and the second device are operated as one of class A amplifiers, class A/B amplifiers, class B amplifiers, class C amplifiers, class E amplifiers, inverse F amplifiers, or class E/F amplifiers.

16. The method of claim 5 wherein the third device and the fourth device are operated as one of class A amplifiers, class A/B amplifiers, class B amplifiers, class C amplifiers, class E amplifiers, inverse F amplifiers, or class E/F amplifiers.

17. The method of claim 9 wherein the first device and the second device are operated as one of class A amplifiers, class A/B amplifiers, class B amplifiers, class C amplifiers, class E amplifiers, inverse F amplifiers, or class E/F amplifiers.

18. The method of claim 9 wherein the third device and the fourth device are operated as one of class A amplifiers, class A/B amplifiers, class B amplifiers, class C amplifiers, class E amplifiers, inverse F amplifiers, or class E/F amplifiers.

19. The method of claim 1 wherein the first device and the second device are operated in opposition to the third device and the fourth device.

20. The method of claim 5 wherein the first device and the second device are operated in opposition to the third device and the fourth device.

* * * * *